United States Patent
Datta et al.

(10) Patent No.: US 7,402,875 B2
(45) Date of Patent: Jul. 22, 2008

(54) LATERAL UNDERCUT OF METAL GATE IN SOI DEVICE

(75) Inventors: Suman Datta, Beaverton, OR (US);
Justin K. Brask, Portland, OR (US);
Jack Kavalieros, Portland, OR (US);
Brian S. Doyle, Portland, OR (US);
Gilbert Dewey, Hillsboro, OR (US);
Mark L. Doczy, Beaverton, OR (US);
Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 30 days.

(21) Appl. No.: 11/207,051

(22) Filed: Aug. 17, 2005

(65) Prior Publication Data

US 2007/0040223 A1   Feb. 22, 2007

(51) Int. Cl.
*H01L 29/72* (2006.01)
(52) U.S. Cl. .......... 257/401; 257/321; 257/340; 257/347; 257/368; 257/388
(58) Field of Classification Search .......... 257/368, 257/321, 340, 347, 388, 401
See application file for complete search history.

(56) References Cited

U.S. PATENT DOCUMENTS

| | | | |
|---|---|---|---|
| 4,906,589 A | 3/1990 | Chao | |
| 5,124,777 A | 6/1992 | Lee | |
| 5,338,959 A | 8/1994 | Kim et al. | |
| 5,346,839 A | 9/1994 | Sundaresan | |
| 5,466,621 A | 11/1995 | Hisamoto et al. | |
| 5,545,586 A | 8/1996 | Koh | 437/89 |
| 5,563,077 A | 10/1996 | Ha | |
| 5,578,513 A | 11/1996 | Maegawa | |
| 5,658,806 A | 8/1997 | Lin et al. | |
| 5,701,016 A | 12/1997 | Burroughs et al. | |
| 5,716,879 A | 2/1998 | Choi et al. | |
| 5,827,769 A | 10/1998 | Aminzadeh et al. | |
| 5,888,309 A | 3/1999 | Yu | |
| 5,905,285 A | 5/1999 | Gardner et al. | |
| 6,013,926 A * | 1/2000 | Oku et al. | 257/284 |
| 6,163,053 A | 12/2000 | Kawashima | |
| 6,252,284 B1 | 6/2001 | Muller et al. | |
| 6,376,317 B1 | 4/2002 | Forbes et al. | |

(Continued)

FOREIGN PATENT DOCUMENTS

EP    0623963 A1    11/1994

(Continued)

OTHER PUBLICATIONS

S.T. Chang et al., "3-D Simulation of Strained Si/SiGe Heterojunction FinFETs", Semiconductor Device Research Symposium, 2003 International, Dec. 10-12, 2003, pp. 176-177.

(Continued)

*Primary Examiner*—Edward Wojciechowicz
(74) *Attorney, Agent, or Firm*—Blakely, Sokoloff, Taylor & Zafman LLP

(57) ABSTRACT

Embodiments of the invention provide a device with a metal gate, a high-k gate dielectric layer, source/drain extensions a distance beneath the metal gate, and lateral undercuts in the sides of the metal gate.

16 Claims, 5 Drawing Sheets

U.S. PATENT DOCUMENTS

| | | | |
|---|---|---|---|
| 6,396,108 B1 | 5/2002 | Krivokapic et al. | |
| 6,407,442 B2 | 6/2002 | Inoue et al. | |
| 6,413,802 B1 | 7/2002 | Hu et al. | |
| 6,413,877 B1 | 7/2002 | Annapragada | |
| 6,475,869 B1 | 11/2002 | Yu | 438/303 |
| 6,475,890 B1 | 11/2002 | Yu | |
| 6,483,156 B1 | 11/2002 | Adkisson et al. | |
| 6,525,403 B2 | 2/2003 | Inaba et al. | |
| 6,562,665 B1 | 5/2003 | Yu | |
| 6,611,029 B1 | 8/2003 | Ahmed et al. | |
| 6,635,909 B2 | 10/2003 | Clark et al. | 257/192 |
| 6,645,797 B1 | 11/2003 | Buynoski et al. | 438/157 |
| 6,680,240 B1 | 1/2004 | Maszara | |
| 6,706,571 B1 | 3/2004 | Yu et al. | |
| 6,709,982 B1 | 3/2004 | Buynoski et al. | 438/696 |
| 6,713,396 B2 | 3/2004 | Anthony | |
| 6,716,684 B1 | 4/2004 | Krivokapic et al. | |
| 6,716,690 B1 | 4/2004 | Wang et al. | |
| 6,730,964 B2 | 5/2004 | Horiuchi | |
| 6,756,657 B1 | 6/2004 | Zhang et al. | |
| 6,764,884 B1 | 7/2004 | Yu et al. | |
| 6,790,733 B1 | 9/2004 | Natzle et al. | |
| 6,794,313 B1 | 9/2004 | Chang | |
| 6,835,618 B1 | 12/2004 | Dakshina-Murthy et al. | |
| 6,858,472 B2 | 2/2005 | Chau et al. | |
| 6,858,478 B2 | 2/2005 | Chau et al. | 438/149 |
| 6,867,433 B2 | 3/2005 | Yeo et al. | |
| 6,869,898 B2 | 3/2005 | Chiu et al. | |
| 6,884,154 B2 | 4/2005 | Mizushima et al. | |
| 6,921,982 B2 | 7/2005 | Joshi et al. | |
| 6,974,738 B2 | 12/2005 | Hareland | |
| 2002/0011612 A1 | 1/2002 | Hieda | 257/262 |
| 2002/0036290 A1 | 3/2002 | Inaba et al. | 257/66 |
| 2002/0081794 A1 | 6/2002 | Ito | |
| 2002/0166838 A1 | 11/2002 | Nagarajan | |
| 2002/0167007 A1 | 11/2002 | Yamazaki et al. | |
| 2003/0057486 A1 | 3/2003 | Gambino et al. | 257/347 |
| 2003/0085194 A1 | 5/2003 | Hopkins, Jr. | |
| 2003/0098488 A1 | 5/2003 | O'Keefe et al. | 257/401 |
| 2003/0102497 A1 | 6/2003 | Fried et al. | |
| 2003/0111686 A1 | 6/2003 | Nowak | |
| 2003/0122186 A1 | 7/2003 | Sekigaw et al. | |
| 2003/0143791 A1 | 7/2003 | Cheong et al. | |
| 2003/0151077 A1 | 8/2003 | Mathew et al. | |
| 2003/0201458 A1 | 10/2003 | Clark et al. | 257/192 |
| 2003/0227036 A1 | 12/2003 | Sugiyama et al. | |
| 2004/0031979 A1 | 2/2004 | Lochtefeld et al. | |
| 2004/0036118 A1 | 2/2004 | Adadeer et al. | |
| 2004/0036127 A1 | 2/2004 | Chau et al. | |
| 2004/0092062 A1 | 5/2004 | Ahmed et al. | |
| 2004/0092067 A1 | 5/2004 | Hanafi et al. | |
| 2004/0094807 A1 | 5/2004 | Chau et al. | |
| 2004/0110097 A1 | 6/2004 | Ahmed et al. | |
| 2004/0119100 A1 | 6/2004 | Nowal et al. | |
| 2004/0126975 A1 | 7/2004 | Ahmed et al. | |
| 2004/0132236 A1* | 7/2004 | Doris et al. | 438/182 |
| 2004/0166642 A1 | 8/2004 | Chen et al. | |
| 2004/0180491 A1 | 9/2004 | Arai et al. | 438/200 |
| 2004/0191980 A1 | 9/2004 | Rios et al. | |
| 2004/0195624 A1 | 10/2004 | Liu et al. | |
| 2004/0198003 A1 | 10/2004 | Yeo et al. | |
| 2004/0219780 A1 | 11/2004 | Ohuchi | |
| 2004/0227187 A1 | 11/2004 | Cheng et al. | |
| 2004/0238887 A1 | 12/2004 | Nihey | |
| 2004/0256647 A1 | 12/2004 | Lee et al. | 257/289 |
| 2004/0262683 A1 | 12/2004 | Bohr et al. | |
| 2004/0262699 A1 | 12/2004 | Rios et al. | |
| 2005/0035415 A1 | 2/2005 | Yeo et al. | |
| 2005/0118790 A1 | 6/2005 | Lee et al. | |
| 2005/0127362 A1 | 6/2005 | Zhang et al. | |
| 2005/0145941 A1 | 7/2005 | Bedella et al. | |
| 2005/0156171 A1 | 7/2005 | Brask et al. | |
| 2005/0156227 A1* | 7/2005 | Jeng | 257/321 |
| 2005/0224797 A1 | 10/2005 | Ko et al. | |
| 2005/0224800 A1 | 10/2005 | Lindert | |

FOREIGN PATENT DOCUMENTS

| | | |
|---|---|---|
| EP | 1 202 335 A2 | 10/2001 |
| EP | 2003298051 | 12/2002 |
| EP | 1 566 844 A2 | 8/2005 |
| JP | 06177089 A | 6/1994 |
| JP | 2003-298510 | 10/2003 |
| WO | WO 02/43151 A1 | 5/2002 |
| WO | WO 2004/059726 A1 | 12/2002 |

OTHER PUBLICATIONS

A. Burenkov et al., "Corner Effect in Double and Triple Gate FinFETs", European Soild-State Device Research, 2003 33$^{rd}$ Conference on Essderc '03 Sep. IEEE, pp. 135-138.

V. Subramanian et al., "A Bulk Si-Compatible Ultrathin-Body SOI Technology for Sub-100nm MOSFETS", Proceedings of the 57$^{th}$ Annual Device Reach Conference, pp. 28-29 (1999).

Hisamoto et al., "A Folded-Channel MOSFET for Deepsub-tenth Micron Era", 1998 IEEE International Electron Device Meeting Technical Digest, pp. 1032-1034 (1998).

Huang et al., "Sub 50nm FinFet: PMOS", 1999 IEEE International Electron Device Meeting Technical Digets, pp. 67-70(1999).

Auth et al., "Vertical, Fully-Depleted, Surroundings Gate MOSFETS on Sub 0.1um Thick Silicon Pillars", 1996 54$^{th}$ Annual Device Research Conference Digest, pp. 108-109 (1996).

Hisamoto et al., "A Fully Depleted Lean-Channel Transistor (DELTA)-A Novel Vertical Ultrathin SOI Mosfet", IEEE Electron Device Letters, Vo. 11(1), pp. 36-38 (1990).

Jong-Tae Park et al., "Pi-Gate SOI Mosfet", IEEE Electron Device Letters, vol. 22, No. 8, Aug. 2001, pp. 405-406.

Hisamoto, Digh et al., "FinFet-A Self Aligned Double-Gate MOSFET Scalable to 20nm", IEEE Transactions on Electron Devices, vol. 12, No. 12, Dec. 2000, pp. 2320-2325.

T. Park et al., "Fabrication of Body-Tied FinFets (Omega MOSFETS) Using Bulk Si Wafers", 2003 Symposia on VLSI Technology Digest of Technical Papers, Jun. 2003, pp. 135-136.

International Search Report PCT/US03/26242, mailed Jan. 26, 2004.

International Search Report PCT/US03/39727, mailed Apr. 27, 2004.

International Search Report PCT/US03/40320, mailed Jun. 2, 2004.

International Search Report PCT/US2005/000947, mailed May 3, 2005.

International Search Report PCT/US2005/010505, mailed Aug. 26, 2005.

International Search Report PCT/US2005/020339, mailed Oct. 4, 2005.

International Search Report PCT/US2005/033439, mailed Jan. 31, 2006.

International Search Report PCT/US2005/035380, mailed Feb. 13, 2006.

International Search Report PCT/US2005/037169, mailed Feb. 23, 2006.

Sung Min Kim, et al., A Novel Multi-channel Field Effect Transistor (McFET) on Bulk Si for High Performance Sub-80nm Application, IEDM 04-639, 2004 IEEE pp. 27.4.1-27.4.4.

Yang-Kyu Choi, et al., "A Spacer Patterning Technology for Nanoscale CMOS", IEEE Transactions on Electron Device, vol. 49, No. 3, Mar. 2002, pp. 436-441.

W. Xiong, et al., "Corner Effect in Multiple-Gate SOI MOSFETs", 2003 IEEE, pp. 111-113.

Weize Xiong, et al., "Improvement of Fin FET Electrical Characteristics by Hydrogen Annealing", IEEE Electron Device Letters, vol. 25, No. 8, Aug. 2004, XP-001198998.

Fu-Liang Yang, et al., "5nm-Gate Nanowire FinFET", 2004 Symposium on VLSI Technology Digest of Technical Papers, 2004, IEEE, pp. 196-197.

T.M. Mayer, et al., "Chemical Vapor Deposition of Fluoroalkylsilane Monolayer Films for Adhesion Control in . . . ", 2000 American Vacuum Society B18(5) Sep.-Oct. 2000, pp. 2433-2440.

B. Jin et al., "Mobility Enhancement in Compressively Strained SiGe Surface Channel PMOS . . . ", Proceedings of the First Joint International Symposium, Oct. 2004, pp. 111-122.

R. Chau, "Advanced Metal Gate/High-K Dielectric Stacks for High-Performance CMOS Transistors", Mar. 2004, 3 pages, Proceedings of AVS 5th Inter Conferance of Microelectrons . . . .

Fried, David M. et al., High-Performance P-Type Independent-Gate FinFETs, IEEE Electron Device Letters, vol. 25, No. 4, Apr. 2004, pp. 199-201.

Fried, David M. et al., "Improved Independent Gate N-Type FinFET Fabrication and Characterization", IEEE Electron Device Letters, vol. 24, No. 9, Sep. 2003, pp. 592-594.

Jing Guo et al., "Performance Projections for Ballistic Carbon Nanotube Field-Effect Transistors" Applied Physics Letters, vol. 80, No. 17, pp. 3192-2194 (Apr. 29, 2002).

Ali Javey et al., "High-K Dielectrics for Advanced Carbon-Nanotube Transistors and Logic Gates", Advance Online Publication, Published online, pp. 1-6 (Nov. 17, 2002).

Kuo, Charles et al., "A Capacitorless Double-Gate DRAM Cell Design for High Density Applications", 2002 IEEE International Electron Devices Meeting Technical Digest Dec. 2002, pp. 843-846.

Kuo, Charles et al., "Capacitorless Double Gate DRAM Technology for Sub-100-nm Embedded and Stand-Alone Memory Applications, IEEE Transactions on Electron Devices", vol. 50, No. 12, Dec. 2003, pp. 2408-2416.

Richard Martel et al., "Carbon Nanotube Field Effect Transistors for Logic Applications" IBM, T.J. Watson Research Center, 2001 IEEE, IEDM 01, pp. 159-162

T.M. Mayer et al., "Chemical Vapor Deposition of Fluoroalkylsilane Monolayer Films for Adhesion Control in Microelectromechanical Systems" 2000 American Vacuum Society B 18(5), Sep./Oct. 2000, pp. 2433-2440.

Ohsawa, Takashi et al., "Memory Design Using a One-Transistor Gain Cell on SOI", IEEE Journal of Solid-State Circuits, vol. 37, No. 11, Nov. 2000, pp. 1510-1522.

Tanaka, T. et al., Scalability Study on a Capacitorless 1T-DRAM: From Single-Gate PD-SOI to Double-Gate FinDram, 2004 IEEE International Electron Devices Meeting Technical Digest, Dec. 2004, 4 pages.

* cited by examiner

LATERAL UNDERCUT OF METAL GATE IN SOI DEVICE

BACKGROUND

Background of the Invention

MOS field-effect transistors on semiconductor on insulator (SOI) substrates may experience unacceptable leakage currents. This may result from source-side amplification of the band-to-band tunneling leakage due to a high vertical E-field in the drain extension region. Conventionally, the gate dielectric may be made thicker to combat this leakage. Thicker gate dielectric results in lower performance and prevents downward scaling of the transistor.

In PMOS SOI metal gate transistors, for example, a thickness of a metal gate on a high-k (high dielectric constant) gate dielectric may be selected to result in a desired threshold voltage ($V_{Th}$). A thicker metal layer may have a higher work function and lower $V_{Th}$. However, a thicker metal gate also results in a higher E-field and more leakage current. Conventionally, the thicker dielectric layer used to prevent leakage current reduces performance of the device, as well as the ability to scale the device to smaller sizes.

DETAILED DESCRIPTION

In various embodiments, an apparatus and method relating to the formation of a substrate are described. In the following description, various embodiments will be described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 1:
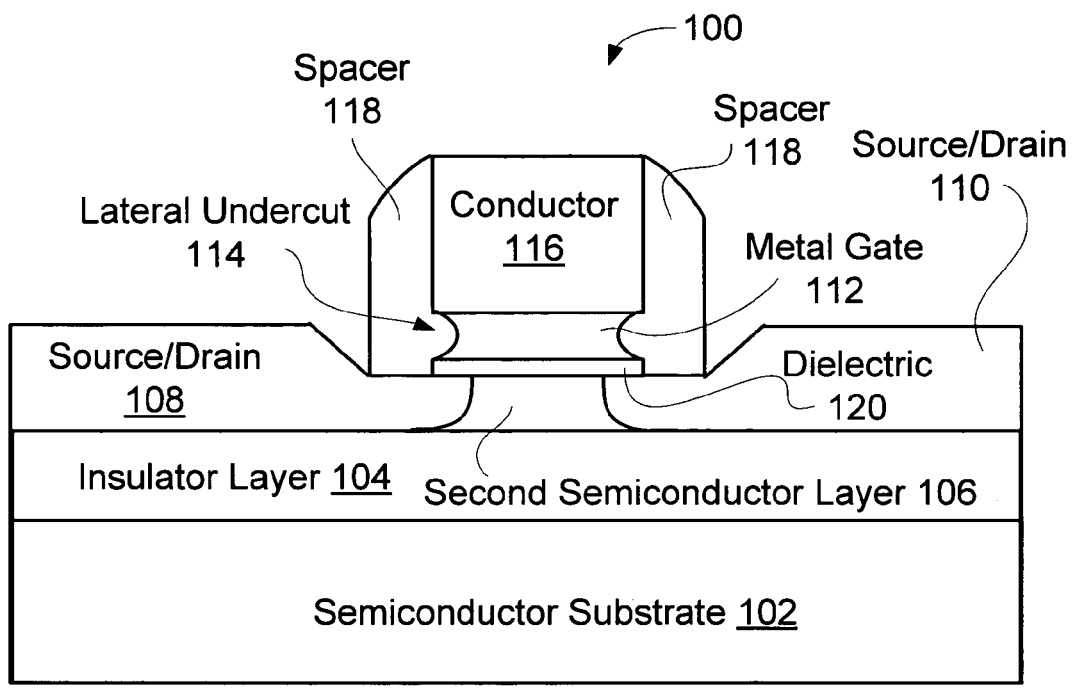
FIG. 1 is a cross sectional side view that illustrates the semiconductor device of one embodiment of the present invention.

FIG. 1 is a cross sectional side view that illustrates the semiconductor device 100 of one embodiment of the present invention. In an embodiment, the device 100 may be a tri-gate transistor on a substrate with a buried insulating layer. Such a tri-gate transistor may have a metal gate and a high-k gate dielectric. In other embodiments, the device 100 may be a different type of transistor, such as a planar transistor, a FIN-FET transistor, or a different type of transistor or other device 100.

The device 100 as illustrated in FIG. 1 may include a semiconductor substrate 102. This semiconductor substrate 102 may be a silicon substrate, such as single crystal silicon, a different type of semiconductor material, or combination of materials. On the semiconductor substrate 102 may be an insulator layer 104. The insulator layer 104 may be a layer of oxide, such as silicon oxide, or another type of insulating material. There may be a second semiconductor layer 106 on the insulator layer 104. The second semiconductor layer 106 may comprise silicon, a different type of semiconductor material, or a combination of materials. In an embodiment, the second semiconductor layer 106 may be a layer of single crystal silicon. In combination, the semiconductor substrate 102, insulator layer 104, and second semiconductor layer 106 may be a semiconductor on insulator substrate (SOI), where each device 100 may be isolated electrically from other devices on the substrate by the insulator layer 104. In an embodiment, the semiconductor on insulator substrate may be a silicon on insulator substrate. As there are two semiconductor layers (substrate 102 and second layer 106), the substrate 102 may be referred to as a first semiconductor layer or a first semiconductor substrate.

The second semiconductor layer 106 may include source/drain regions 108, 110 in some embodiments. These source/drain regions 108, 110 may be formed by doping the second semiconductor layer 106 in some embodiments. In other embodiments, the source/drain regions 108, 110 may be formed by removing portions of the second semiconductor layer 106 and replacing the removed portions with other materials. The source/drain regions 108, 110 may include extensions so that the source/drain regions 108, 110 reach beneath structures such as dielectric layer 120 and/or metal gate 112 that are above the second semiconductor layer 106.

There may be a dielectric layer 120 on the second semiconductor layer 106 in some embodiments. The dielectric layer 120 may have a length (the distance from left to right in FIG. 1). The dielectric layer 120 may be a high-k dielectric layer 120 in some embodiments. A high-k gate dielectric layer 120 may have a k-value higher than about 7.5 in some embodiments. In other embodiments, a high-k dielectric layer 120 may have a k-value higher than about 10. In other embodiments, a high-k dielectric layer 120 may comprise a material such as $Al_2O_3$ with a k-value of about 12, or may comprise a material with a higher k-value than that. In other embodiments, a high-k dielectric layer 120 may have a k-value between about 15 and about 25, e.g., $HfO_2$. In yet other embodiments, a high-k dielectric layer 120 may have a k-value even higher, such as 35, 80 or even higher.

There may be a metal gate 112 on the dielectric layer 120 in some embodiments. The metal gate 112 may have a thickness (distance from top of metal gate 112 to bottom of metal gate 112 in FIG. 1) selected for a desired work function and threshold voltage ($V_{Th}$) of the gate. The metal gate 112 may have lateral undercuts 114 in its side walls. As shown in FIG. 1, the metal gate 112 has a lateral undercut 114 on a first side of the metal gate 112 (the left side) and a lateral undercut 114 on a second side of the metal gate 112 (the right side). The lateral undercuts 114 may reduce the length (the distance from left to right in FIG. 1) of the metal gate 112 so that it is less than the length of the dielectric layer 120.

There may be a conductor 116 on the metal gate 112 in some embodiments. The conductor 116 may comprise polysilicon or another material and/or combination of materials. The conductor 116 may have a length (the distance from left to right in FIG. 1) that, because of the lateral undercuts 114 of the metal gate 112, is greater than the length of the metal gate 112. The length of the conductor 116 may be about the same as the length of the dielectric layer 120 in some embodiments, although in other embodiments it may be different. There may also be silicide regions (not shown) on the conductor 116 and source/drain regions 108, 110 to which contacts may be formed in some embodiments.

There may be a set of spacers 118 formed on either side of the dielectric layer 120, metal gate 112, and conductor 116. The spacers 118 may be formed of an insulating material in some embodiments, such as a nitride or oxide. The spacers 118 may fill in the lateral undercuts 114 of the metal gate 112.

The lateral undercuts 114 may reduce the vertical E-field in the portions of the metal gate 112 over the source/drain extensions beneath the metal gate 112, which may reduce leakage current when the device 100 is in an off state. This may allow the device 100 to have a thin dielectric layer 120 while still having a thick metal gate 112 and an acceptable level of leakage current. Thus, the thickness of the metal gate 112, and the threshold voltage of the device 100 may be chosen without requiring a thick dielectric layer 120, allowing the device 100 to have increased performance.

Figure 2:
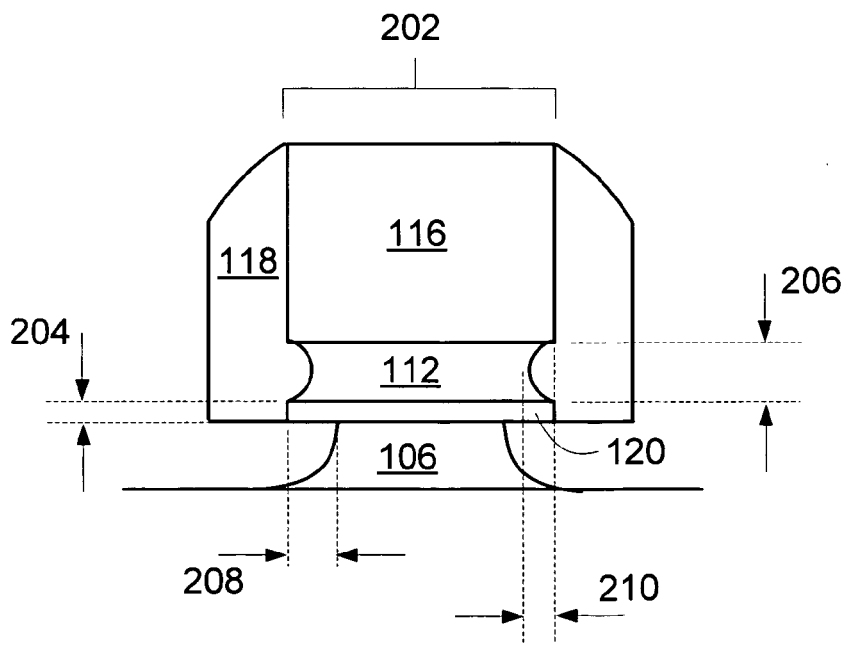
FIG. 2 is a cross sectional side view that illustrates a portion of the semiconductor device of one embodiment of the present invention in more detail.

FIG. 2 is a cross sectional side view that illustrates a portion of the semiconductor device 100 of one embodiment of the present invention in more detail. As shown in FIG. 2, there may be a length 202 that is substantially the same for the conductor 116 and dielectric layer 120. Prior to formation of the lateral undercuts 114, the metal gate 112 may also have a length 202 that is substantially the same as those of the conductor 116 and dielectric layer 120. The lateral undercuts 114 may reduce the length of the metal gate 112 in some embodiments. In other embodiments, the lateral undercuts 114 may leave small portions at the top and bottom of the metal gate 112 with substantially the same length 202 while reducing the length of the metal gate 112 more towards the center of the metal gate's thickness 206. The maximum distance between the edges of the metal gate 112 (at the top and bottom of the metal gate 112 in FIG. 2) is the maximum gate length. The minimum distance between the edges of the metal gate 112 (at the center of the metal gate's thickness 206 in FIG. 2) is the minimum gate length. Even in embodiments where small portions at the top and bottom of the metal gate 112 remain the same length as the lengths of the dielectric layer 120 and conductor 116, because the center of the metal gate 112 has a smaller length, the metal gate 112 will be considered to have an "effective length" less than the lengths of the dielectric layer 120 and conductor 116. In some embodiments, the effective length of the metal gate 112 is between the maximum and minimum gate lengths. In an embodiment, the metal gate 112 may have a maximum length of 30-35 nm, a minimum length of 25-30 nm and an effective length of 27-32 nm. In other embodiments, these lengths may be different.

The metal gate 112 may have a thickness 206. This thickness may be chosen to provide a desired work function and threshold voltage ($V_{Th}$) of the gate of the device 100. In an embodiment, the thickness 206 may between about 50 angstroms and about 200 angstroms. In other embodiments, the thickness may be greater than about 75 angstroms. In yet other embodiments, the thickness 206 may be different. The dielectric layer 120 may also have a thickness 204. In some embodiments, the dielectric layer 120 may have a thickness 204 less than about 25 angstroms, although in other embodiments the thickness 204 may be different.

The source/drain regions 108, 110 may each extend a distance 208 beneath the dielectric layer 120 and the metal gate 112 in some embodiments. The distance 208 is the distance between the outermost edge of the metal gate 112 and the furthest depth of the extension of the source/drain regions 108, 110 beneath the metal gate 112. The distance 210 may be considered the depth of the source/drain region 108, 110 extensions beneath the metal gate 112. The lateral undercuts 114 may extend a distance 210 from the outermost edge of the metal gate 112. The distance 210 is thus the distance between the outermost edge of the metal gate 112 and the greatest depth of the lateral undercut 114. The distance 210 may be considered the depth of the lateral undercuts 114. In an embodiment, the distance 208 may be greater than the distance 210. In an embodiment, the distance 210 may be between about one-quarter the distance 208 and about three-quarters of the distance 208. In another embodiment, the distance 210 may be about one-half the distance 208. In an embodiment, the distance 208 may be between about 10 nm and about 5 nm, and the distance 210 may be between about 7.5 nm and about 3.5 nm. In other embodiments, the distances 208, 210 may be different.

The lateral undercuts 114 in the metal gate 112 may reduce the vertical E-field between the metal gate 112 and the portions of the source/drain regions 108, 110 that extend under the dielectric layer 120. This reduction in vertical E-field may reduce the leakage current without necessitating increasing the thickness of the dielectric layer 120.

FIGS. 3 through 7 are cross sectional side views that illustrate how the device 100 of FIG. 1 may be formed, according to one embodiment of the current invention. In other embodiments, the device 100 may be formed differently.

Figure 3:
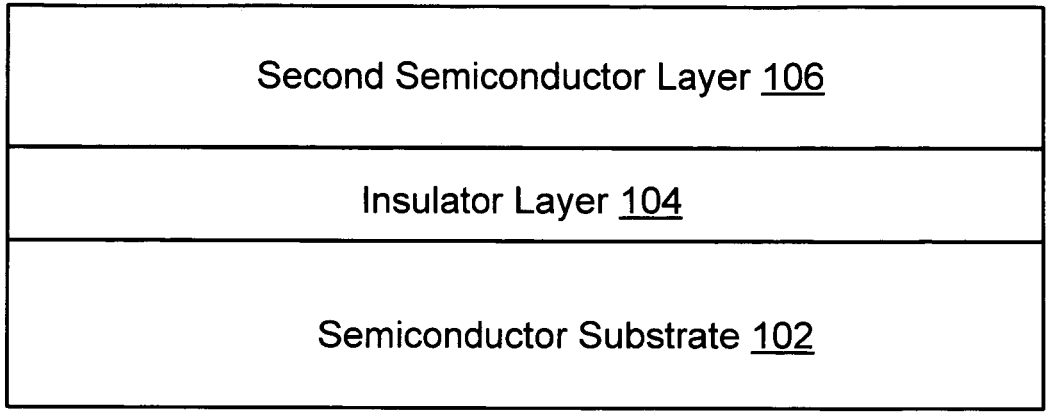
FIG. 3 is a cross sectional side view that illustrates a SOI substrate that may be used in the device.

FIG. 3 is a cross sectional side view that illustrates a SOI substrate that may be used in the device 100. As described above, the SOI substrate may include a semiconductor substrate layer 102, which may also be referred to as a first semiconductor layer 102. This semiconductor substrate 102 may comprise any suitable semiconductor material or materials, including silicon. On the semiconductor substrate 102 may be an insulating layer 104. The insulating layer 104 may comprise any suitable insulating material and may function to electrically isolate various devices formed on the substrate. In embodiments where the insulating layer 104 comprises an oxide, the insulating layer may also be referred to as a buried oxide layer. On the insulating layer 104 may be a second semiconductor layer 106. The second semiconductor layer 106 may comprise any suitable semiconductor material or materials, including silicon.

Figure 4:
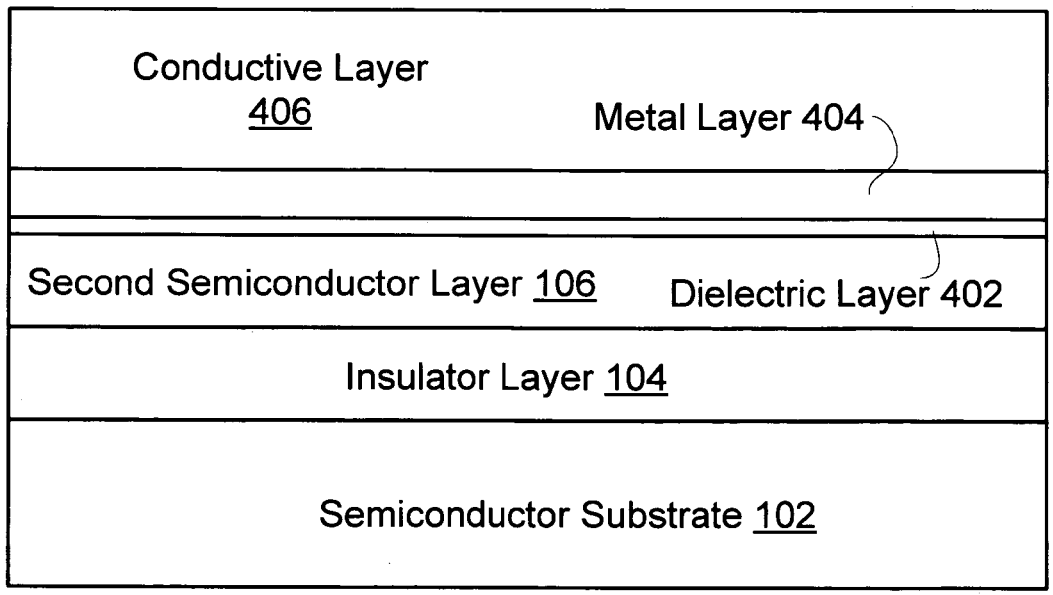
FIG. 4 is a cross sectional side view that illustrates the SOI substrate after a dielectric layer, metal layer, and conductive layer have been deposited.

FIG. 4 is a cross sectional side view that illustrates the SOI substrate after a dielectric layer 402, metal layer 404, and conductive layer 406 have been deposited, according to one embodiment of the present invention. The dielectric layer 402, metal layer 404, and conductive layer 406 may become the dielectric layer 120, metal gate 112, and conductor 116 shown in FIG. 1 after further processing.

The dielectric layer 402 may be a high-k dielectric layer in some embodiments. Such a high-k dielectric layer 402 may comprise, for example, hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Although a few examples of materials that may be used to form the dielectric layer 402 are described here, the dielectric layer 402 may be made from other materials.

In one embodiment of the present invention, the dielectric layer 402 may be formed on the second semiconductor layer 106 by an atomic layer chemical vapor deposition ("ALCVD") process. In an ALCVD process, a growth cycle may be repeated until a dielectric layer 402 of a desired thickness is created. Such a growth cycle may comprise the following sequence in an embodiment. Steam is introduced into a CVD reactor for a selected pulse time, followed by a purging gas. A precursor (e.g., an organometallic compound, a metal chloride or other metal halide) is then pulsed into the reactor, followed by a second purge pulse. (A carrier gas that comprises nitrogen or another inert gas may be injected into the reactor at the same time.)

While operating the reactor at a selected pressure and maintaining the substrate at a selected temperature, steam, the purging gas, and the precursor may, in turn, be fed at selected flow rates into the reactor. By repeating this growth cycle—steam, purging gas, precursor, and purging gas—multiple times, one may create a dielectric layer 402 of a desired thickness on the second semiconductor layer 106. The pressure at which the reactor is operated, the gases' flow rates, and the temperature at which the substrate is maintained may be varied depending upon the application and the precursor that is used. The CVD reactor may be operated long enough to form the dielectric layer 402 with the desired thickness. The thickness 204 of the dielectric layer 120 of the device 100 may be substantially the same as the thickness of the dielectric layer 402 deposited on the second semiconductor layer 106. As discussed above, the dielectric layer 120 in the device 100 with lateral undercuts 114 may have a small thickness 204 and leakage current may still be at an acceptable level. This may allow scaling of device sizes and increased performance.

After forming the dielectric layer 402, the metal layer 404 may be formed on the dielectric layer 402. Metal layer 404 may be formed using conventional metal deposition processes, e.g., CVD or PVD processes, by using ALCVD, or another suitable method, and may comprise any conductive material from which metal gate electrodes may be derived. Materials that may be used to form n-type metal layers 404 (used in NMOS devices) include: hafnium, zirconium, titanium, tantalum, aluminum, their alloys (e.g., metal carbides that include these elements, i.e., hafnium carbide, zirconium carbide, titanium carbide, tantalum carbide, and aluminum carbide), and aluminides (e.g., an aluminide that comprises hafnium, zirconium, titanium, tantalum, or tungsten). Materials for forming p-type metal layers 404 (used in PMOS devices) include: ruthenium, palladium, platinum, cobalt, nickel, and conductive metal oxides, e.g., ruthenium oxide. Alternatively, a mid-gap metal gate material, e.g. stoichiometric titanium nitride or tantalum nitride, may be used in the metal layer 404 in some embodiments.

In some embodiments, metal layers 404 for NMOS devices may have a workfunction that is between about 3.9 eV and about 4.2 eV. In some embodiments, metal layers 404 for PMOS devices may have a workfunction that is between about 4.9 eV and about 5.2 eV. In some embodiments, metal layers 404 for mid-gap devices may have a workfunction between the workfunctions of NMOS and PMOS gate electrode materials.

A conductive layer 406 may be formed on the metal layer 404 in some embodiments. The conductive layer 406 may comprise any suitable conductive material, such as polysilicon, tungsten, aluminum, titanium, titanium nitride, or other materials or combinations of materials.

Figure 5:
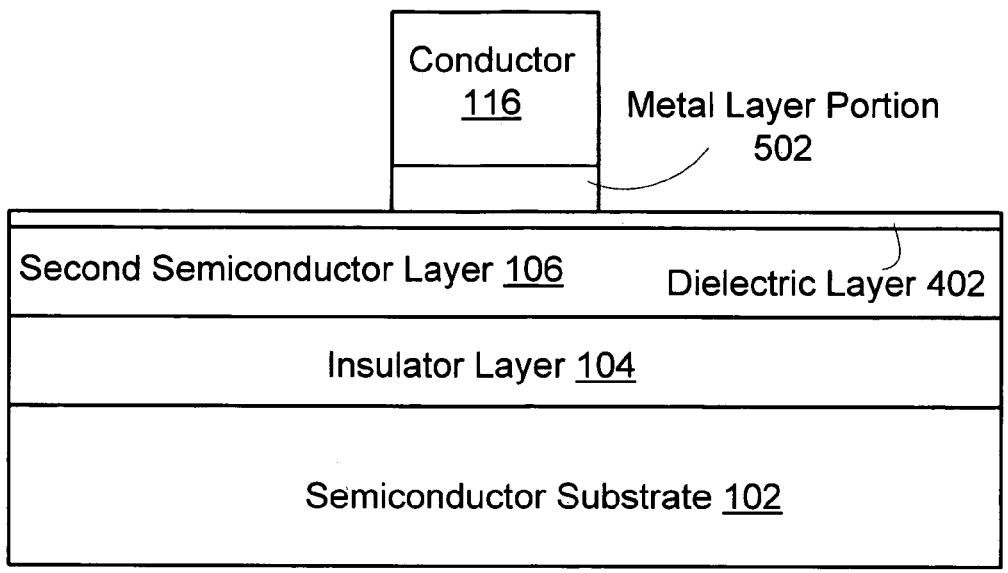
FIG. 5 is a cross sectional side view that illustrates the device after the conductive layer and metal layer have been patterned.

FIG. 5 is a cross sectional side view that illustrates the device 100 after the conductive layer 406 and metal layer 404 have been patterned, according to one embodiment of the present invention. Any suitable method may be used to pattern the conductive layer 406 to form the conductor 116 and to pattern the metal layer 404 to result in a metal layer portion 502. For example, the portions of the conductive layer 406 and metal layer 404 desired to remain in place may be protected by patterned photoresist and/or hardmask material and exposed portions of the conductive layer 406 and metal layer 404 removed by an etching procedure, such as a plasma-based dry etch.

Figure 6:
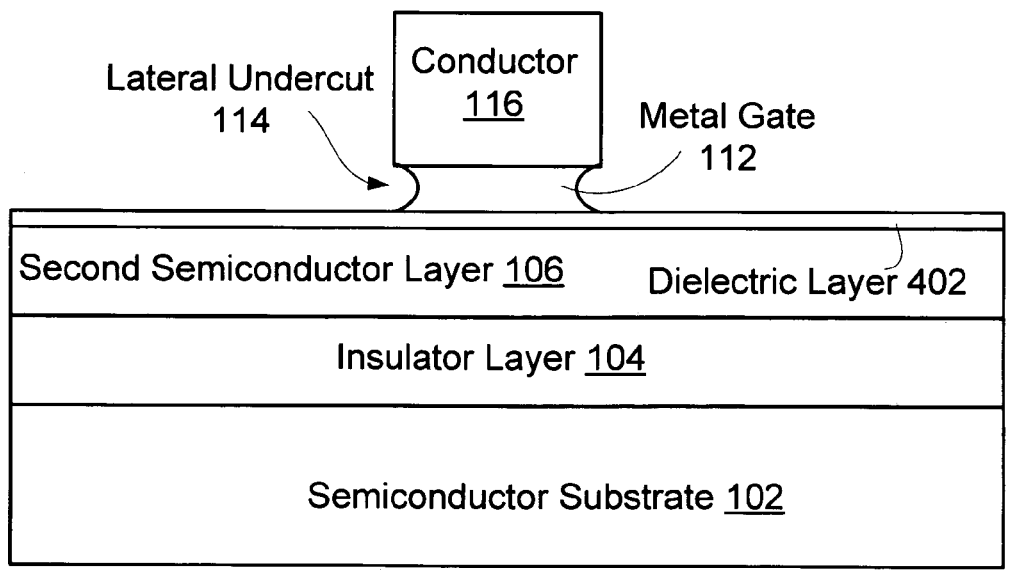
FIG. 6 is a cross sectional side view that illustrates the device after the metal layer portion has been etched to form lateral undercuts.

FIG. 6 is a cross sectional side view that illustrates the device 100 after the metal layer portion 502 has been etched to form lateral undercuts 114, resulting in the metal gate 112 of FIG. 1, according to one embodiment of the present invention. In an embodiment, the metal layer portion 502 may be selectively wet etched to form the lateral undercuts 114. In another embodiment, the metal layer portion 502 may be selectively etched by a combination wet and isotropic dry etch to form the lateral undercuts 114. In yet other embodiments, other methods may be used. As is discussed above, the lateral undercuts 114 may reduce the length of the metal gate 112.

Figure 7:
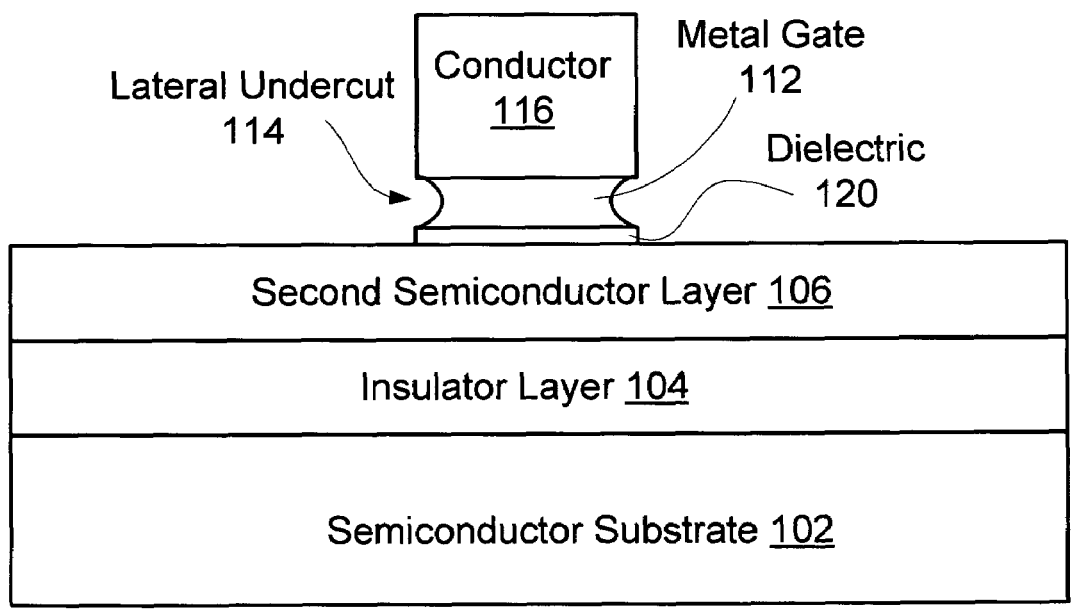
FIG. 7 is a cross sectional side view that illustrates the device after the dielectric layer is patterned to form the dielectric layer.

FIG. 7 is a cross sectional side view that illustrates the device 100 after the dielectric layer 402 is patterned to form the dielectric layer 120, according to one embodiment of the present invention. Any suitable method, such as a dry etch, may be used to remove the portions of the dielectric layer 402 that are not used as the dielectric layer 120.

In other embodiments, the dielectric layer 402 may be patterned prior to forming the lateral undercuts 114, rather than after. In such embodiments, care may be taken to avoid removing portions of the dielectric layer 402 while making the lateral undercuts 114; removal of portions of the dielectric layer 402 while making the lateral undercuts 114 could result in gate to source/drain shorts.

Additional processes may then be performed to result in the device 100 as illustrated in FIG. 1. For example, these additional processes may include formation of the spacers 118, doping of portions of the second semiconductor layer 106 to form source/drain regions 108, 110, addition of material to the second semiconductor layer 106 to form the raised portions on either side of the spacers 118 shown in FIG. 1, silicidation to form contacts, and other additional processes.

Figure 8:
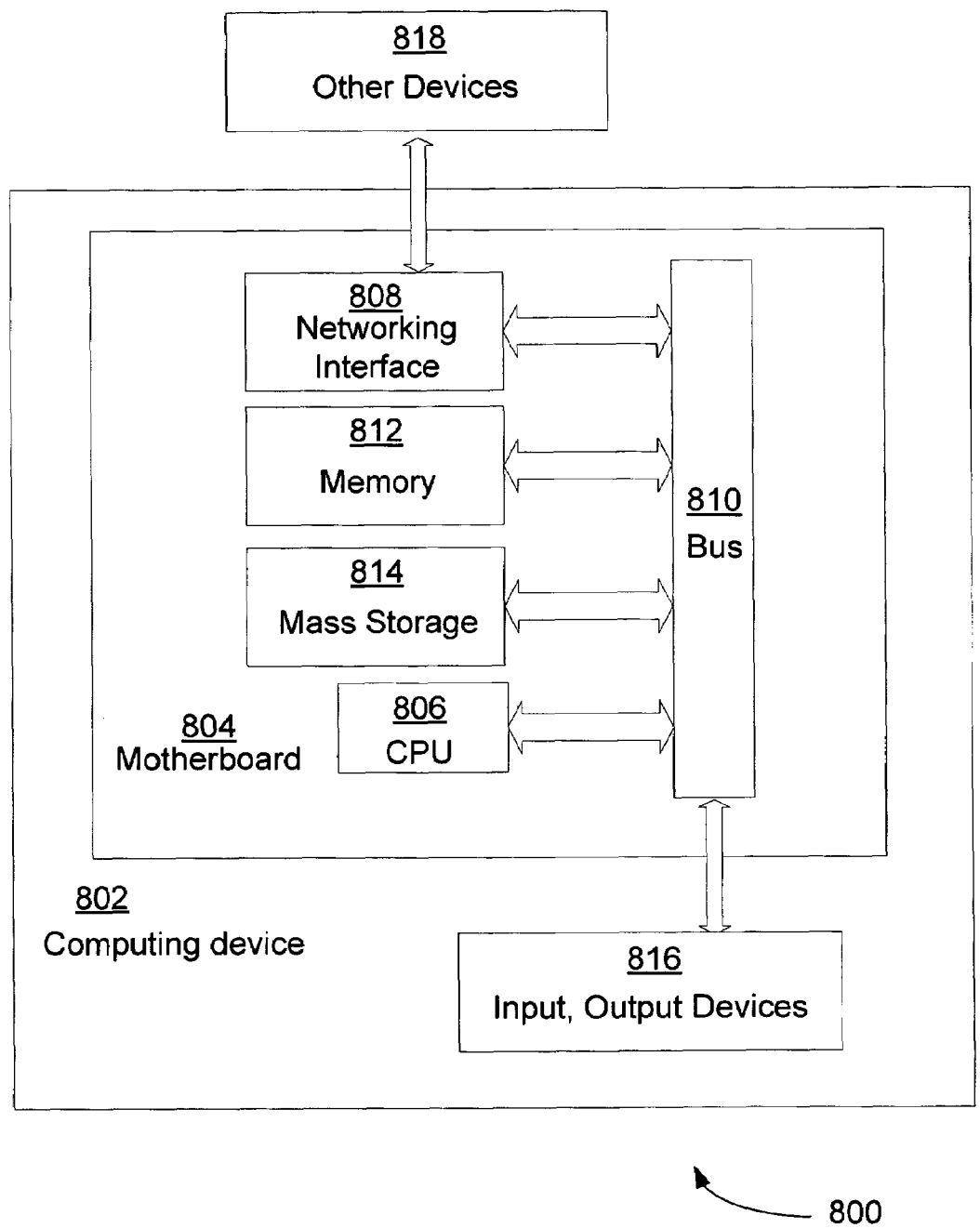
FIG. 8 illustrates a system in accordance with one embodiment of the present invention.

FIG. 8 illustrates a system 800 in accordance with one embodiment of the present invention. One or more devices 100 formed with lateral undercuts 114 as described above may be included in the system 800 of FIG. 8. As illustrated, for the embodiment, system 800 includes a computing device 802 for processing data. Computing device 802 may include a motherboard 804. Coupled to or part of the motherboard 804 may be in particular a processor 806, and a networking interface 808 coupled to a bus 810. A chipset may form part or all of the bus 810. The processor 806, chipset, and/or other parts of the system 800 may include one or more devices 100 formed with lateral undercuts 114.

Depending on the applications, system 800 may include other components, including but are not limited to volatile and non-volatile memory 812, a graphics processor (integrated with the motherboard 804 or connected to the motherboard as a separate removable component such as an AGP or PCI-E graphics processor), a digital signal processor, a crypto processor, mass storage 814 (such as hard disk, compact disk (CD), digital versatile disk (DVD) and so forth), input and/or output devices 816, and so forth.

In various embodiments, system 800 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

Any of one or more of the components 806, 814, etc. in FIG. 8 may include one or more devices 100 formed with lateral undercuts 114 as described herein. For example, a transistor formed with the lateral undercuts 114 may be part of the CPU 806, motherboard 804, graphics processor, digital signal processor, or other devices.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A semiconductor device, comprising:
a first semiconductor substrate;
an insulator layer on the semiconductor substrate;
a second semiconductor layer on the insulator layer;
a dielectric layer on the second semiconductor layer; and
a metal layer on the dielectric layer, wherein the metal layer includes curved lateral undercuts that are deepest around a center of the metal layer's thickness and that taper off towards a top and a bottom surface of the metal layer so the metal layer has an effective length less than a length of the dielectric layer.

2. The device of claim 1, further comprising a conductive layer on the metal layer, wherein the effective length of the metal layer is less than a length of the conductive layer.

3. The device of claim 1, wherein the metal layer is a metal gate electrode and the device is a transistor.

4. The device of claim 3, further comprising:
a source region on a first side of the second semiconductor layer, the source region extending a first distance under the dielectric layer;
a drain region on a second side of the second semiconductor layer, the drain region extending a second distance under the dielectric layer, the second distance being about equal to the first distance; and
wherein the lateral undercuts in the metal layer extend at least about one quarter the first distance on the first side and at least about one quarter the second distance on the second side.

5. The device of claim 4, wherein the lateral undercuts in the metal layer extend between about one quarter the first distance and about three-quarters the first distance on the first side and between about one quarter the second distance and about three-quarters the second distance on the second side.

6. The device of claim 4, further comprising spacers on first and second sides of the metal layer, the spacers filling the lateral undercuts in the metal layer.

7. The device of claim 1, wherein the metal layer has a thickness between about 50 angstroms and about 200 angstroms.

8. The device of claim 7, wherein the metal layer has a maximum length of about 30-35 nanometers.

9. The device of claim 1, wherein the metal layer has a thickness of at least about 75 angstroms.

10. The device of claim 1, wherein dielectric layer has a thickness less than about 30 angstroms.

11. A semiconductor device, comprising:
a first semiconductor layer;
an insulating layer on the semiconductor substrate;
a second semiconductor layer on the insulator layer;
a dielectric layer on the second semiconductor layer;
a metal gate on the dielectric layer, wherein the metal gate has curved lateral undercuts extending into a center of the metal gate's thickness and tapering off towards a top and a bottom surface of the metal gate, wherein each lateral undercut has a depth laterally measured from an outermost edge of the metal gate to a greatest depth of the lateral undercut;
source and drain regions of the second semiconductor layer on either side of the metal gate, wherein the source and drain regions have extensions that go a lateral depth under the metal gate measured from the outermost edge of the metal gate to a furthest depth of the extension; and
wherein the depth of the lateral undercuts is less than the depth of the source and drain region extensions.

12. The device of claim 11, wherein the dielectric layer comprises a high-k dielectric material.

13. The device of claim 12, wherein the metal gate comprises a mid-gap metal gate material.

14. The device of claim 11, wherein the metal gate has a thickness of at least about 50 angstroms.

15. The device of claim 14, wherein the metal gate has a maximum length of about 30-35 nanometers and the depth of the lateral undercuts is between about 7.5 and about 3.5 nanometers.

16. The device of claim 15, wherein dielectric layer comprises a high-k dielectric material and has a thickness less than about 30 angstroms.

* * * * *